US009190339B2

(12) United States Patent
Chan et al.

(10) Patent No.: US 9,190,339 B2
(45) Date of Patent: Nov. 17, 2015

(54) METHOD OF LIMITING CAPILLARY ACTION OF GEL MATERIAL DURING ASSEMBLY OF PRESSURE SENSOR

(71) Applicants: Soon Kang Chan, Segar Jaya (MY); Voon Kwai Leong, Sri Petaling (MY); Wai Keong Wong, Shah Alam (MY)

(72) Inventors: Soon Kang Chan, Segar Jaya (MY); Voon Kwai Leong, Sri Petaling (MY); Wai Keong Wong, Shah Alam (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 84 days.

(21) Appl. No.: 14/170,653

(22) Filed: Feb. 3, 2014

(65) Prior Publication Data

US 2015/0221572 A1    Aug. 6, 2015

(51) Int. Cl.
| | |
|---|---|
| *H01L 21/00* | (2006.01) |
| *H01L 23/31* | (2006.01) |
| *H01L 21/56* | (2006.01) |
| *H01L 23/04* | (2006.01) |
| *B81C 1/00* | (2006.01) |
| *B81B 7/00* | (2006.01) |
| *G01L 9/00* | (2006.01) |

(52) U.S. Cl.
CPC .......... *H01L 23/3107* (2013.01); *B81B 7/0038* (2013.01); *B81C 1/00285* (2013.01); *G01L 9/0098* (2013.01); *H01L 21/56* (2013.01); *H01L 23/04* (2013.01); *B81B 2201/0264* (2013.01); *H01L 2224/48091* (2013.01); *H01L 2224/48137* (2013.01); *H01L 2224/48247* (2013.01); *H01L 2224/73265* (2013.01); *H01L 2224/8592* (2013.01); *H01L 2924/0002* (2013.01)

(58) Field of Classification Search
CPC ..... H01L 23/3107; H01L 23/04; H01L 21/56; H01L 33/60; H01L 33/20; H01L 33/62; H01L 33/54; H01L 33/58
USPC ............... 438/22, 24, 26, 27, 28, 46–47, 102, 438/106, 113, 461; 257/88, 84, 100, 98
See application file for complete search history.

(56) References Cited

U.S. PATENT DOCUMENTS

| | | | |
|---|---|---|---|
| 4,920,972 | A | 5/1990 | Frank |
| 5,266,827 | A | 11/1993 | Kato |
| 6,020,219 | A | 2/2000 | Dudderar |
| 6,740,972 | B2 | 5/2004 | Smith |
| 6,844,632 | B2 | 1/2005 | Shiono |
| 8,378,435 | B2 | 2/2013 | Lo |
| 2007/0028699 | A1 | 2/2007 | Chen |
| 2010/0055815 | A1* | 3/2010 | Kim et al. .................. 438/29 |
| 2010/0289055 | A1 | 11/2010 | Tan |

* cited by examiner

Primary Examiner — Hoa B Trinh
(74) Attorney, Agent, or Firm — Charles Bergere

(57) ABSTRACT

A method for applying a pressure-sensitive gel material during assembly of an array of pre-singulated packaged semiconductor devices. In the method, pressure-sensitive gel material is dispensed onto a first semiconductor device of the array, where the first semiconductor device is disposed within a first cavity. A first curing process is performed to partially cure the pressure-sensitive gel material in the first cavity. Pressure-sensitive gel material is then dispensed onto another semiconductor device of the array, where the other semiconductor device is disposed within another cavity. The first curing process is initiated before the dispensing of the pressure-sensitive gel material inside of the other cavity is completed and initially cures pressure-sensitive gel material for fewer than all of the pre-singulated packaged semiconductor devices of the array.

11 Claims, 3 Drawing Sheets

METHOD OF LIMITING CAPILLARY ACTION OF GEL MATERIAL DURING ASSEMBLY OF PRESSURE SENSOR

BACKGROUND

The present invention relates generally to semiconductor packaging, and, more particularly, to a method of assembling a semiconductor pressure sensor device.

Semiconductor sensor devices, such as pressure sensors, are well known. Such devices use semiconductor pressure-sensing dies to sense the ambient atmospheric pressure. These dies are susceptible to mechanical damage during packaging and environmental damage when in use, and thus they must be carefully packaged. Further, pressure-sensing dies, such as piezo resistive transducers (PRTs) and parameterized layout cells (P-cells), do not allow full encapsulation because that would impede their functionality.

FIG. 1(A) shows a cross-sectional side view of a prior-art packaged semiconductor sensor device 100. FIG. 1(B) shows a perspective top view of the sensor device 100 partially assembled, and FIG. 1(C) shows a perspective top view of the sensor device 100 with a lid 104 attached.

As shown in FIG. 1, the sensor device 100 is encased in a molding compound 102, which has a cavity 124 formed therein. Inside the cavity 124, a pressure sensor die (P-cell) 106, an acceleration-sensing die (G-cell) 108, and a micro-control unit (MCU) die 110 are adhesively-attached onto a lead frame flag 112 (sometimes referred to as a die paddle). The P-cell 106, G-cell 108, and MCU die 110 are electrically interconnected to one another and to lead frame leads 118 via one or more bond wires 120 (one of which is shown in FIG. 1(A)).

The P-cell 106 is designed to sense ambient atmospheric pressure, while the G-cell 108 is designed to sense gravity or acceleration in one, two, or all three axes, depending on the particular implementation. The MCU 110 controls, for example, the operations of and the processing of signals generated by the P-cell 106 and the G-cell 108. The P-cell 106, the G-cell 108, and the MCU 110 are well-known components of semiconductor sensor devices and thus detailed descriptions thereof are not necessary for a complete understanding of the present invention.

The cavity 124 is partially filled with a pressure-sensitive gel material 114, which enables the pressure of the ambient atmosphere to reach the pressure-sensitive active region on the top side of the P-cell 106. The pressure-sensitive gel material 114 protects all of the dies 106, 108, 110 and the one or more bond wires 120 from mechanical damage during packaging and environmental damage (e.g., contamination and/or corrosion) when in use. The cavity 124 is covered by a lid 104, which has a vent hole 116 that exposes the gel-covered P-cell 106 to ambient atmospheric pressure outside the sensor device 100.

The gel material 114 is applied using, for example, a nozzle of a conventional dispensing machine (not shown), as is known in the art. After dispensing, the gel material 114 is cured by, for example, placing the sensor device 100 in an oven. Note, however, that there is commonly a delay between the time that the gel material 114 is dispensed and the time that the gel material 114 is oven-cured. For example, this delay can be caused by normal production flow delays such as waiting for space to become available in the oven.

As another example, if the sensor device 100 is assembled as part of a strip (i.e., a one row, multi-column array) or a magazine of strips (i.e., a multi-row, multi-column array) of similar sensor devices (not shown) on a shared substrate, then the gel material 114 may need to be dispensed onto one or more of the other similar sensor devices, after being dispensed onto sensor device 100. Thus, there is a delay while waiting for the gel material 114 to be dispensed onto the other similar sensor devices.

Once the gel material 114 has been dispensed onto all of the sensor devices, the gel material 114 for all of the sensor devices on the strip or magazine can be cured concurrently by placing the whole strip or magazine into the oven. After curing, the sensor devices on the strip or magazine can be separated from one another using, for example, saw or laser singulation.

During the delay between dispensing and oven-curing, capillary action shapes the upper surface 122 of the gel material 114. The capillary action occurs because the adhesion of the gel material 114 to the inner walls of the molding compound 102 is stronger than the cohesive forces between the molecules of the gel material 114. The adhesion causes an upward force on the gel material 114 at the inner walls of the molding compound 102 and results in a meniscus (i.e., the upper surface 122) that turns upward. The height to which the gel material 114 climbs the inner walls of the molding compound 102 is limited by surface tension and gravity.

If the curvature of the upper surface 122 becomes too great, then portions of the one or more bond wires 120 (and possibly even portions of the dies 106, 108, and 110) may become exposed to the ambient atmosphere above the gel material 114 as shown in FIG. 1(A). Exposure of the one or more bond wires 102 and the dies 106, 108, and 110 to the ambient atmosphere can result in environmental damage (e.g., contamination and/or corrosion) to the sensor device 100.

To prevent portions of the bond wires 102 and dies 106, 108, and 110 from becoming exposed, the amount of the gel material 114 dispensed by the dispensing machine for each sensor device could be increased. However, increasing the amount of the gel material 114 dispensed could have several adverse effects.

First, increasing the amount of the gel material 114 dispensed increases the cost of each sensor device, and possibly, the size of each sensor device if the cavity needs to be made deeper to prevent the gel material from coming too close to the lid.

Second, increasing the amount of the gel material 114 dispensed could have a negative impact on the function of some sensor devices in a strip or magazine. The precise amount of the gel material 114 dispensed, and the amount of capillary action that occurs, may vary from one sensor device to the next. Therefore, without additional gel material 114, the bond wires and dies of some sensor devices might be adequately covered. If the amount of the gel material 114 is increased for these adequately-covered sensor devices, then the height of the gel material 114 over the pressure-sensitive active region of the P-cell may become too great to allow for accurate sensing of the ambient atmospheric pressure.

Further adding to this height issue, in some implementations, a gel cap 130 is applied to the P-cell 106 before application of the gel material 114. Like the gel material 114, this optional gel cap 130 enables the pressure of the ambient atmosphere to reach the pressure-sensitive active region on the top side of the P-cell 106. When employed, gel caps similar to gel cap 130 are dispensed onto all of the P-cells on the strip or magazine, and the gel caps for all of the sensor devices on the strip or magazine are cured concurrently, before application of the gel material 114, by placing the whole strip or magazine into an oven.

BRIEF DESCRIPTION OF THE DRAWINGS

Embodiments of the present invention are illustrated by way of example and are not limited by the accompanying figures, in which like references indicate similar elements. Elements in the figures are illustrated for simplicity and clarity and have not necessarily been drawn to scale. For example, the thicknesses of layers and regions may be exaggerated for clarity.

DETAILED DESCRIPTION

Detailed illustrative embodiments of the present invention are disclosed herein. However, specific structural and functional details disclosed herein are merely representative for purposes of describing example embodiments of the present invention. Embodiments of the present invention may be embodied in many alternative forms and should not be construed as limited to only the embodiments set forth herein. Further, the terminology used herein is for the purpose of describing particular embodiments only and is not intended to be limiting of example embodiments of the present invention.

As used herein, the singular forms "a," "an," and "the," are intended to include the plural forms as well, unless the context clearly indicates otherwise. It further will be understood that the terms "comprises," "comprising," "has," "having," "includes," and/or "including" specify the presence of stated features, steps, or components, but do not preclude the presence or addition of one or more other features, steps, or components. It also should be noted that, in some alternative implementations, the functions/acts noted may occur out of the order noted in the figures. For example, two figures shown in succession may in fact be executed substantially concurrently or may sometimes be executed in the reverse order, depending upon the functionality/acts involved.

Certain embodiments of the present invention are directed to methods for assembling packaged semiconductor sensor devices that (i) prevent capillary action from exposing the bond wires and the dies of the sensor devices to the ambient atmosphere and (ii) do not significantly impact the cost, size, and function of the sensor devices.

One embodiment of the present invention is a method for applying a pressure-sensitive gel material during assembly of an array of pre-singulated packaged semiconductor devices. In the method, pressure-sensitive gel material is dispensed onto a first semiconductor device of the array, where the first semiconductor device is mounted inside a first cavity. A curing process is applied to at least partially cure the pressure-sensitive gel material inside the first cavity. Further, pressure-sensitive gel material is dispensed onto another semiconductor device of the array, wherein the other semiconductor device is mounted inside another cavity. The curing process is initiated before the dispensing of the pressure-sensitive gel material inside of the other cavity is completed and initially cures pressure-sensitive gel material for fewer than all of the pre-singulated packaged semiconductor devices of the array.

Another embodiment of the present invention is a packaged semiconductor device assembled by the method described above.

Figure 2:
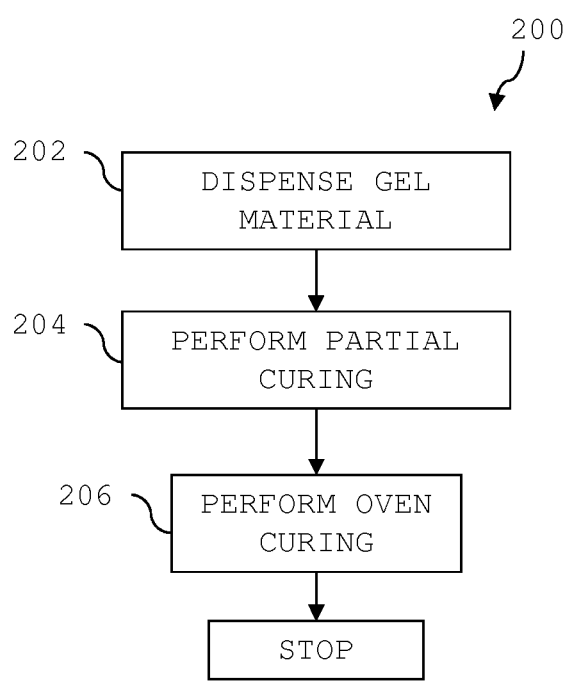
FIG. 2 shows a simplified flow diagram of a method for applying a pressure-sensitive gel material to a packaged semiconductor sensor device according to one embodiment of the present invention.

FIG. 2 shows a simplified flow diagram of a method 200 for applying a pressure-sensitive gel material to a packaged semiconductor sensor device according to one embodiment of the present invention. In step 202, the pressure-sensitive gel material is dispensed onto the packaged semiconductor sensor device using, for example, a nozzle of a conventional dispensing machine, as is known in the art. The pressure-sensitive gel material may be a silicon-based gel, and examples of suitable gel materials are available from Dow Corning Corporation of Midland, Mich.

Figure 1:
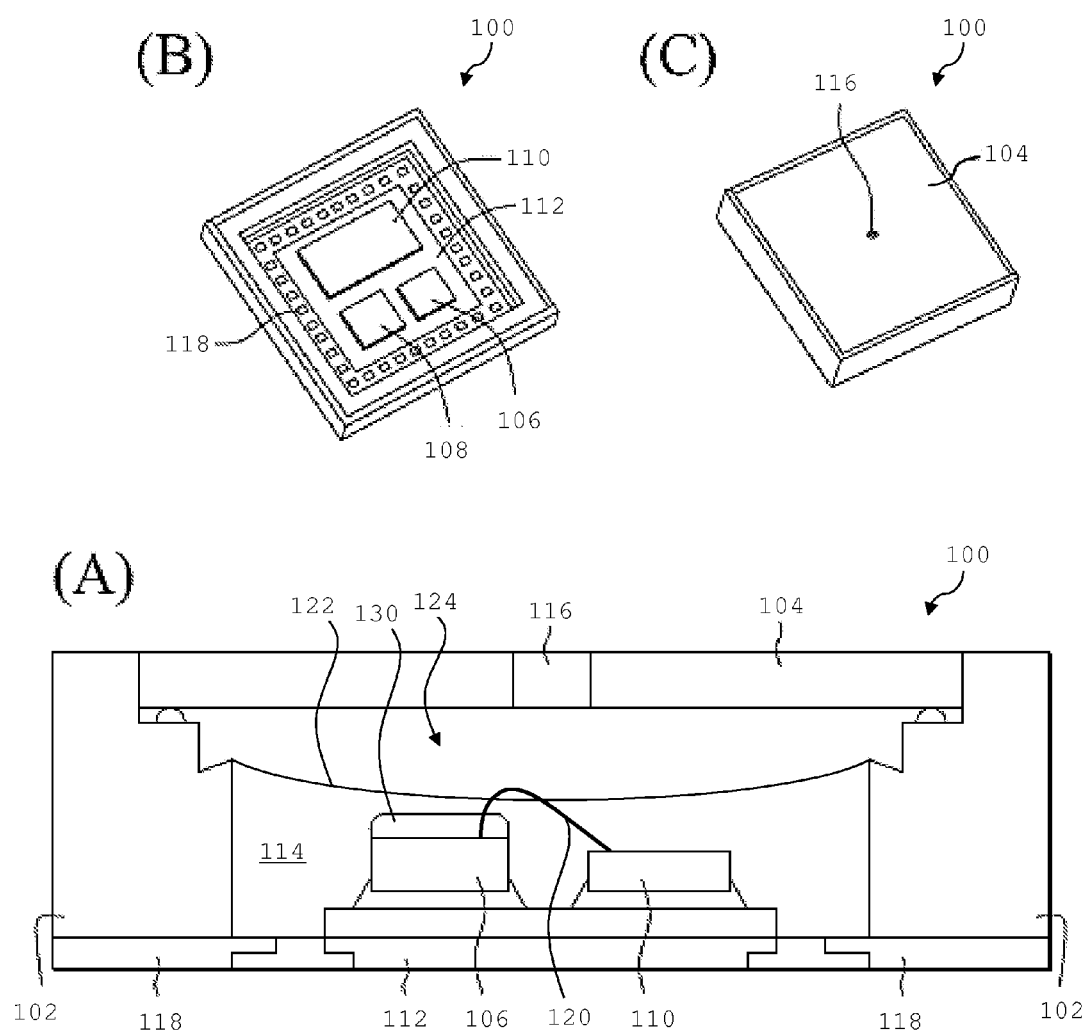
FIG. 1 shows a conventional packaged semiconductor sensor device.
Figure 3:
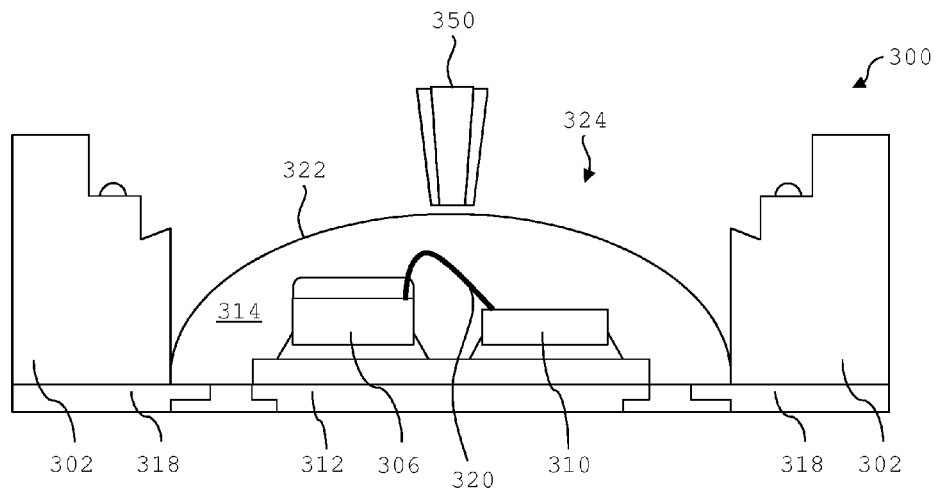
FIG. 3 shows a cross-sectional side view that illustrates a step of dispensing a pressure-sensitive gel material onto a packaged semiconductor sensor device according to one embodiment of the present invention.

FIG. 3 shows a cross-sectional side view that illustrates step 202 of FIG. 2 of dispensing a pressure-sensitive gel material 314 onto a packaged semiconductor sensor device 300 according to one embodiment of the present invention. The sensor device 300 has molding compound 302 that defines a cavity 324 formed therein, a pressure sensor die (P-cell) 306, a micro-control unit (MCU) die 310, a lead frame flag 312, lead frame leads 318, one or more bond wires 320, and optionally a gel cap 330, which are similar to the analogous components in FIG. 1. Although not shown in this view, the sensor device 300 may also have an acceleration-sensing die (G-cell) similar to the G-cell 108 of FIG. 1.

The gel material 314 is dispensed into the cavity 324 and onto and around the P-cell 306, the MCU 310, the G-cell (not shown), and the bond wires 320 using a nozzle 350 of a dispensing machine (not shown). As shown, initially upon dispensing the gel material 314, the upper surface 322 of the gel material 314 is convex in shape. However, if not prevented, over time, capillary action will cause the gel material 314 to climb up the inner walls of the molding compound 302 until the upper surface 322 becomes concave in shape, like upper surface 122 of FIG. 1(A).

Sensor device 300 may be assembled in a one-dimensional strip or two-dimensional magazine of similar sensor devices on a shared substrate. In such cases, the gel material 314 may be dispensed onto the packages on a package-by-package basis using one nozzle or on a set-by-set basis using a plurality of nozzles (e.g., two packages at a time using two nozzles).

Referring back to FIG. 2, after dispensing the gel material 314, and before the capillary action is completed, the gel material 314 is partially cured in step 204. This partial curing is performed to stop the capillary action before one or more of the P-cell 306, the MCU 310, the G-cell (not shown), and the bond wires 320 become exposed to the ambient environment above the cavity 324.

Figure 4:
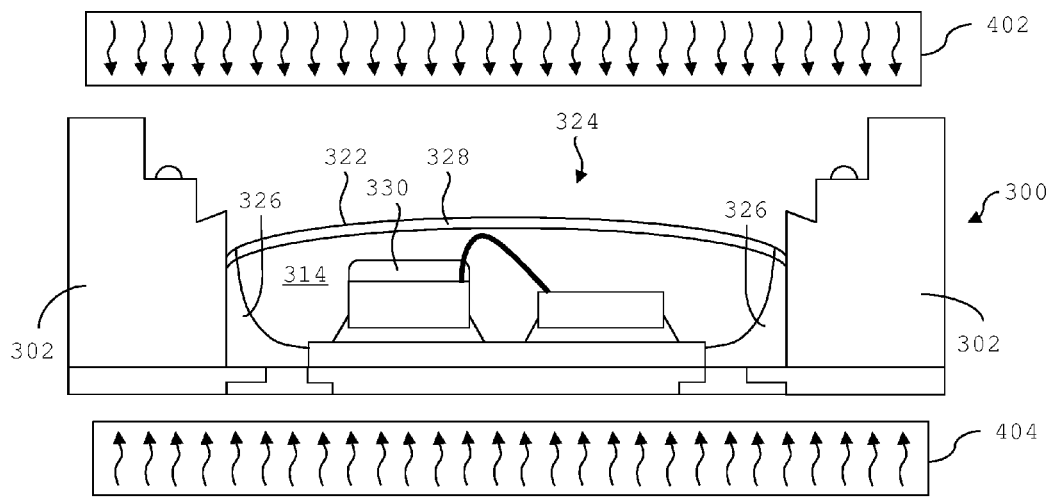
FIG. 4 shows a cross-sectional side view that illustrates a step of partially curing a gel material of a packaged sensor device according to one embodiment of the present invention.

FIG. 4 shows a cross-sectional side view that illustrates step 204 of FIG. 2 of partially curing the gel material 314 of the sensor device 300 according to one embodiment of the present invention. The partial curing may be performed using one or both of an overhead curing device 402 and an underneath curing device 404.

The overhead curing device 402 (when employed) cures an upper layer 328 of the gel material 314 using any suitable curing technique, including (without limitation) applying one or more of (i) forced room-temperature air, (ii) stagnant or forced hot air, (iii) stagnant or forced hot gas, (iv) ultra-violet radiation, (v) infrared radiation, (vii) radio frequency signals, and (viii) microwave signals to the gel material 314. Curing the upper layer 328 increases the viscosity of the upper layer 328, and consequently, the surface tension of the upper surface 322, such that the surface tension forces of the upper surface 322 become stronger than the adhesive forces of the gel material 314 to the inner walls of the molding compound 302.

The underneath curing device 404 (when employed) cures a perimeter layer 326 of the gel material 314 that extends along the bottom of the cavity 324 around the lead frame flag 312 and part of the way up the inner walls of the molding compound 302. The underneath curing device 404 may implement any suitable curing technique, including those described above in relation to overhead curing device 402. Curing the perimeter layer 326 increases the viscosity of the perimeter layer 326, and consequently, the cohesive forces between the molecules in the perimeter layer 326 such that the cohesive forces between the molecules become stronger than the adhesive forces of the gel material 314 to the inner walls of the molding compound 302.

As a result of the partial curing step 204, the gel material 314 is prevented from climbing further up the inner walls of the molding compound 302. In the embodiment shown in FIG. 4, some capillary action has occurred. This is evident by the fact that the curvature of the upper surface 322 has decreased from FIG. 3 to FIG. 4. However, the partial curing step 204 prevents the capillary action from happening to such a degree that one or more of the bond wires 320, the P-cell 306, the MCU 110, and the G-cell (not shown) become exposed.

When the sensor device 300 is assembled in a strip or magazine of similar sensor devices, partial curing step 204 may begin for the sensor device 300 before dispensing of the gel material 314 is completed for a last of the sensor devices on the strip or magazine. Starting the partial curing before dispensing is complete helps to reduce the delay wherein the capillary action can occur.

Further, when performing partial curing of a strip or magazine of devices, one or both of the overhead and underneath curing devices 402 and 404 may be implemented to (i) target a specific package or set of packages on the strip or magazine at a time and (ii) move from one package or set of packages to the next as the gel material 314 is applied. Alternatively, one or both of the overhead and underneath curing devices 402 and 404 may be implemented to target the entire strip or magazine at a time, without being moved from one package or set of packages to the next, such that the gel material 314 would immediately begin curing as it is applied to sensor devices. Thus, in this alternative implementation, curing would be initiated for only a few sensor devices, but the number of devices being cured would increase as the gel material 314 is applied to further sensor devices until curing is performed on all of the devices in the strip or magazine.

Although not specifically shown, one or both of the upper and lower curing devices 402 and 404 could perform partial curing indirectly by heating the molding compound 302. The heated molding compound 302 in turn would heat a perimeter layer of the gel material 314, thereby creating a cured perimeter layer (not shown) similar to the perimeter layer 326. Note, however, that this perimeter layer might not extend along the bottom of the cavity 324 around the lead frame flag 312 like the perimeter layer 326.

Returning to FIG. 2, after partial curing is performed on the sensor device 300, a final curing step 206 is performed by placing the sensor device 300 in an oven. If the sensor device 300 is assembled in a strip or magazine of similar sensor devices on a shared substrate, then the final curing step 206 may be performed by placing the entire strip or magazine into the oven after the gel material 314 has been applied to the other sensor devices. The sensor devices can then be separated using, for example, saw or laser singulation.

Note that, in alternative embodiments of the present invention, one or both of the overhead and underneath curing devices 402 and 404 may completely cure the gel material 314, rather than just an upper layer 328 and a perimeter layer 326. In such embodiments, the final curing step 206 may eliminated.

Further, in alternative embodiments of the present invention, the final curing step 206 may be performed using a curing technique other than curing in an oven, including, but not limited to, the curing techniques described above in relation to the overhead curing device 402. If the sensor device is assembled in a strip or magazine of sensor devices, then the final curing step 206 may be performed concurrently for the entire strip or magazine.

FIGS. 3 and 4 show an embodiment of the present invention in which the molding compound 302 forms a gel retainer that houses the gel material 314. However, embodiments of the present invention are not limited to gel retainers formed of molding compound. According to alternative embodiments of the present invention, a gel retainer (not shown) may be formed out of metal, plastic, or other suitable material. The gel retainer may then be encased in the molding compound.

Further, in alternative embodiments of the present invention, gel retainers may have sizes and shapes other than that shown in FIGS. 3 and 4.

According to alternative embodiments of the present invention, the MCU may implement both the functionality of an MCU and the functionality of one or more other sensors, such as an acceleration-sensing G-cell, in which latter case, the G-cell may be omitted. Furthermore, a single die may function as the MCU, the pressure-sensing die, and possibly one or more other sensors, in which case, the packaged device may have only that one die.

Although the semiconductor package 300 in FIGS. 3 and 4 was described as having a P-cell 306, a G-cell (not shown), and an MCU 310 positioned within the cavity 324, those skilled in the art will understand that, in alternative embodiments, other configurations are possible. For example, one or both of the G-cell and the MCU 310 could be positioned outside of the cavity 324. In such embodiments, the G-cell and/or MCU 310 may be encapsulated in the mold compound 302. As another example, dies could be mounted on top of other dies. For example, the P-cell 306 could be mounted on top of the MCU 310.

Although an embodiment of the present invention was described as having elements (e.g., dies and leads) that are electrically interconnected using bond wires, embodiments of the present invention are not so limited. According to alternative embodiments of the present invention, these elements may be electrically interconnected using other suitable techniques. It will be understood that, as used herein, the term "electrical interconnection" refers to a connection that may be made using one or more of bond wires, flip-chip bumps, traces, and other conductors used to electrically interconnect one die to another die or to a substrate, such as a leadframe.

Further, as used herein, the term "package element" refers to any element of a packaged semiconductor device, including (without limitation) dies, substrates, leads, bond wires, flip-chip bumps, traces, and other conductors.

By now it should be appreciated that there has been provided an improved packaged semiconductor device and a method of forming the improved packaged semiconductor device. Circuit details are not disclosed because knowledge thereof is not required for a complete understanding of the invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

Terms of orientation such as "lower," "upper," "horizontal," "vertical," "above," "below," "up," "down," "top," "bottom," "right," and "left" well as derivatives thereof (e.g., "horizontally," "vertically," etc.) should be construed to refer to the orientation as shown in the drawing under discussion. These terms of orientation are for convenience of description and do not require that the apparatus be constructed or operated in a particular orientation.

It will be further understood that various changes in the details, materials, and arrangements of the parts which have been described and illustrated in order to explain the nature of this invention may be made by those skilled in the art without departing from the scope of the invention as expressed in the following claims.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. A method for applying pressure-sensitive gel material during assembly of an array of pre-singulated packaged semiconductor devices, the method comprising:
    (a) dispensing pressure-sensitive gel material onto a first semiconductor device of the array, wherein the first semiconductor device is disposed within a first cavity;
    (b) performing a first curing process to partially cure the pressure-sensitive gel material inside the first cavity, wherein the first curing process limits capillary action of the pressure-sensitive gel material, and wherein the first curing process comprises using both of (i) an overhead curing device positioned above the first semiconductor device and (ii) an underneath curing device positioned under a substrate of the first semiconductor device;
    (c) dispensing pressure-sensitive gel material onto another semiconductor device of the array, wherein:
        the other semiconductor device is mounted inside another cavity;
        step (b) is initiated before step (c) is completed; and
        the first curing process initially cures pressure-sensitive gel material for fewer than all of the pre-singulated packaged semiconductor devices of the array; and
    (d) performing a second curing process to complete the curing of the pressure-sensitive gel material, wherein the second curing process is performed simultaneously on all of the semiconductor devices of the array.

2. The method of claim 1, wherein the pressure-sensitive gel material is dispensed in step (a) such that the pressure-sensitive gel contacts inner walls of the first cavity.

3. The method of claim 1, wherein the first curing process comprises curing one or both of (i) an upper layer of the pressure-sensitive gel material inside the first cavity and (ii) a perimeter layer of the pressure-sensitive gel material that is adjacent to an inner wall of the first cavity.

4. The method of claim 1, wherein:
    the pressure-sensitive gel material is dispensed into the first cavity with a convex shape; and
    the first curing process stops the capillary action before an upper-most surface of the pressure-sensitive gel material inside the first cavity becomes concave in shape.

5. The method of claim 1, wherein the first curing process stops the capillary action before the capillary action exposes, to ambient atmosphere above the first semiconductor device, any portion of (i) the first semiconductor device and (ii) one or more electrical interconnections between the first semiconductor device and at least one other package element.

6. The method of claim 1, wherein the first curing process is applied to fewer than all of the pre-singulated packaged semiconductor devices of the array.

7. The method of claim 1, wherein the first curing process is applied to all of the pre-singulated packaged semiconductor devices of the array, even those in which pressure-sensitive gel material has not yet been dispensed.

8. A packaged semiconductor device assembled by the method of claim 1.

9. A method for applying pressure-sensitive gel material during assembly of a pressure sensor device, the method comprising:
    covering a pressure sensor die with a pressure-sensitive gel material, wherein the die is disposed within a cavity and the gel material contacts inner walls of the cavity;
    performing a first curing process to partially cure an upper layer of the gel material, wherein the first curing process comprises using both of (i) an overhead curing device positioned above the pressure sensor die and (ii) an underneath curing device positioned under a substrate of the pressure sensor die, and wherein said partially cured upper layer limits capillary action of the gel material inside the cavity;
    performing a second curing process to complete curing of the pressure-sensitive gel material inside the first cavity, wherein the gel material has a convex shape when first dispensed into the cavity, and the first curing process stops the capillary action before an upper-most surface of the gel material inside the cavity becomes concave in shape; and
    placing a lid over the cavity.

10. The method of claim 9, wherein the first curing process cures one or both of an upper layer of the gel material inside the cavity, and a perimeter layer of the gel material that is adjacent to the inner walls of the cavity.

11. The method of claim 9, wherein the first curing process stops the capillary action before the capillary action exposes, to ambient atmosphere above the pressure sensor die, any portion of the pressure sensor die, and one or more electrical interconnections between the pressure sensor die and at least one other package element.

* * * * *